US006753241B2

(12) United States Patent
Dennison (10) Patent No.: US 6,753,241 B2
(45) Date of Patent: Jun. 22, 2004

(54) SEMICONDUCTOR PROCESSING METHODS OF FORMING CONTACT OPENINGS, METHODS OF FORMING ELECTRICAL CONNECTIONS AND INTERCONNECTIONS, AND INTEGRATED CIRCUITRY

(75) Inventor: Charles H. Dennison, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/956,274

(22) Filed: Sep. 18, 2001

(65) Prior Publication Data

US 2002/0013047 A1 Jan. 31, 2002

Related U.S. Application Data

(60) Continuation of application No. 09/565,196, filed on May 4, 2000, now Pat. No. 6,323,087, which is a division of application No. 09/146,840, filed on Sep. 3, 1998, now Pat. No. 6,242,302.

(51) Int. Cl.$^7$ ............................................. H01L 21/3205
(52) U.S. Cl. ..................... 438/586; 438/639; 438/675
(58) Field of Search .................................... 438/233, 299, 438/586, 588, 598, 618, 622, 625, 639, 652, 672, 675

(56) References Cited

U.S. PATENT DOCUMENTS

| | | |
|---|---|---|
| 4,024,626 A | 5/1977 | Leupp et al. |
| 4,700,276 A | 10/1987 | Freyman et al. |
| 4,700,473 A | 10/1987 | Freyman et al. |
| 5,100,838 A | 3/1992 | Dennison |

(List continued on next page.)

FOREIGN PATENT DOCUMENTS

| | | |
|---|---|---|
| EP | 0 587 399 A2 | 3/1994 |
| EP | 0 599 592 A1 | 6/1994 |
| JP | 11008379 | 1/1999 |

OTHER PUBLICATIONS

F. White et al., "Damascene Stud Local Interconnect in CMOS Technology," IEEE Technical Digest of the 1992 International Electron Devices Meeting, pp. 301–304 (1992).

Primary Examiner—Chandra Chaudhari
(74) Attorney, Agent, or Firm—Wells St. John P.S.

(57) ABSTRACT

Methods of forming contact openings, making electrical interconnections, and related integrated circuitry are described. Integrated circuitry formed through one or more of the inventive methodologies is also described. In one implementation, a conductive runner or line having a contact pad with which electrical communication is desired is formed over a substrate outer surface. A conductive plug is formed laterally proximate the contact pad and together therewith defines an effectively widened contact pad. Conductive material is formed within a contact opening which is received within insulative material over the effectively widened contact pad. In a preferred implementation, a pair of conductive plugs are formed on either side of the contact pad laterally proximate thereof. The conductive plug(s) can extend away from the substrate outer surface a distance which is greater or less than a conductive line height of a conductive line adjacent which the plug is formed. In the former instance and in accordance with one aspect, such plug(s) can include a portion which overlaps with the contact pad of the associated conductive line.

41 Claims, 5 Drawing Sheets

U.S. PATENT DOCUMENTS

| | | |
|---|---|---|
| 5,187,604 A | 2/1993 | Taniguchi et al. |
| 5,208,170 A | 5/1993 | Kobeda et al. |
| 5,229,326 A | 7/1993 | Dennison et al. |
| 5,278,438 A | 1/1994 | Kim et al. |
| 5,350,712 A | 9/1994 | Shibata |
| 5,506,450 A | 4/1996 | Lee et al. |
| 5,538,922 A | 7/1996 | Cooper et al. |
| 5,633,201 A | 5/1997 | Choi |
| 5,654,589 A | 8/1997 | Huang et al. |
| 5,661,054 A | 8/1997 | Kauffman et al. |
| 5,684,316 A | 11/1997 | Lee |
| 5,700,706 A | 12/1997 | Juengling |
| 5,736,444 A | 4/1998 | Kauffman et al. |
| 5,751,039 A | 5/1998 | Kauffman et al. |
| 5,798,534 A | 8/1998 | Young |
| 5,895,961 A | 4/1999 | Chen |
| 5,899,742 A | 5/1999 | Sun |
| 5,959,322 A | 9/1999 | Lee |
| 5,972,758 A | 10/1999 | Liang |
| 6,004,361 A | 12/1999 | Barry et al. ............... 438/675 |
| RE36,518 E | 1/2000 | Dennison et al. |
| 6,110,798 A | 8/2000 | Gonzalez et al. |
| 6,127,214 A * | 10/2000 | Niuya ........................ 438/224 |
| 6,157,430 A | 12/2000 | Kubota et al. |
| 6,159,788 A * | 12/2000 | Jenq et al. .................. 438/253 |
| 6,166,794 A | 12/2000 | Sung |
| 6,242,302 B1 | 6/2001 | Dennison |
| 6,323,087 B1 * | 11/2001 | Dennison .................... 438/257 |

* cited by examiner

SEMICONDUCTOR PROCESSING METHODS OF FORMING CONTACT OPENINGS, METHODS OF FORMING ELECTRICAL CONNECTIONS AND INTERCONNECTIONS, AND INTEGRATED CIRCUITRY

CROSS REFERENCE TO RELATED APPLICATION

This patent application is a Continuation Application of U.S. patent application Ser. No. 09/565,196, filed May 4, 2000, now U.S. Pat. No. 6,323,087B1, entitled "Semiconductor Processing Methods of Forming Contact Openings, Methods of Forming Electrical Connections and Interconnections, and Integrated Circuitry", naming Charles H. Dennison as inventor, which is a Divisional Application of U.S. patent application Ser. No. 09/146,840, filed Sep. 3, 1998, now U.S. Pat. No. 6,242,302, the disclosures of which are incorporated by reference.

TECHNICAL FIELD

This invention relates to semiconductor processing methods of forming contact openings, methods of forming electrical connections and interconnections, and integrated circuitry comprising such contact openings and electrical connections and interconnections.

BACKGROUND OF THE INVENTION

Figure 1:
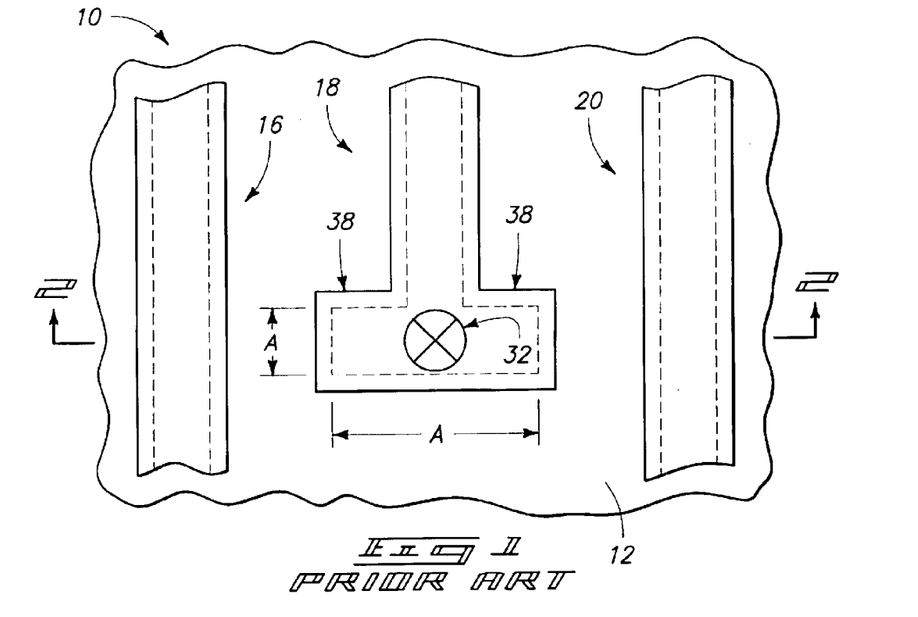
FIG. 1 is a top plan view of a prior art semiconductor wafer fragment and a plurality of conductive lines supported thereon.
Figure 2:
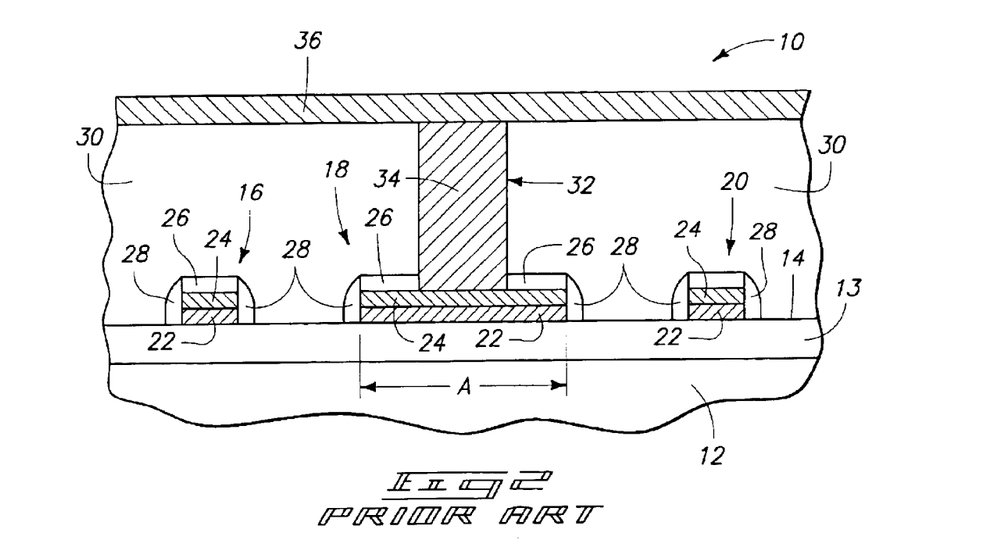
FIG. 2 is a view which is taken along line 2—2 in FIG. 1 at a subsequent processing step.

Referring to FIGS. 1 and 2, a semiconductor wafer fragment is indicated generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 comprises a field oxide region 13 having an outer surface 14 (FIG. 2) over which a plurality of conductive runners or conductive lines 16, 18, and 20 are formed. The illustrated conductive lines or runners include conductive portions and insulative portions. Exemplary conductive portions are constituted, in this example, by a respective polysilicon layer 22 and an overlying silicide layer 24. The insulative portions of the runners or lines are constituted by respective overlying caps 26 and associated sidewall spacers 28. Exemplary materials for the insulative portions include oxides and nitrides.

An insulative layer 30 such as borophosphosilicate glass is formed over runners 16, 18, and 20 and a contact opening 32 is formed through a masked etch of layer 30 to outwardly expose a portion of silicide layer 24. Thereafter, conductive material such as conductively doped polysilicon is formed within contact opening 32 to provide a conductive contact 34 to conductive line 18. A metal layer 36 is provided thereover to form an electrical connection with conductive line 18.

A typical practice within the semiconductor industry is to provide a conductive line or runner with a widened landing pad in order to accommodate mask misalignments when contact openings are formed. An exemplary widened landing pad is shown in FIG. 1 at 38 and FIG. 2 by area A. By having a widened landing pad, contact opening 32 can shift left or right some distance relative to the position shown in FIGS. 1 and 2 without making undesirable contact with the substrate. For purposes of the ongoing discussion, landing pad 38 includes the conductive and insulative portions of conductive line 18; and the conductive portions of conductive line 18 define a contact pad with which electrical communication is desired. Accordingly, in the illustrated example a contact pad is defined by polysilicon layer 22 and silicide layer 24 of conductive line 18. The contact pad defines a target area A inside of which it is desirable to form a contact opening. An electrical connection through contact opening 32 can be formed anywhere within target area A and still effectively make a desirable connection with the conductive contact pad. Hence, the target area tolerates a contact opening mask misalignment on either side of the illustrated and desired contact opening 32. A tradeoff for improved mask misalignment tolerance is a reduction in wafer real estate available for supporting conductive lines and other integrated circuitry components. This is due largely in part to the increased area which is occupied by the widened landing pad 38. This also adversely impacts the conductive line spacing such that desired minimum spacing adjacent conductive lines is not achieved. Hence, integrated circuitry cannot be packed as densely upon a wafer as is desirable when the widened landing pads are used.

This invention grew out of concerns associated with enhancing the efficiency with which wafer real estate is used to support integrated circuitry. This invention also grew out of concerns associated with improving the methods and structures through which contact is made relative to conductive lines.

SUMMARY OF THE INVENTION

Methods of forming contact openings, making electrical interconnections, and related integrated circuitry are described. Integrated circuitry formed through one or more of the inventive methodologies is also described. In one implementation, a conductive runner or line having a contact pad with which electrical communication is desired is formed over a substrate outer surface. A conductive plug is formed laterally proximate the contact pad and together therewith defines an effectively widened contact pad. Conductive material is formed within a contact opening which is received within insulative material over the effectively widened contact pad. In a preferred implementation, a pair of conductive plugs are formed on either side of the contact pad laterally proximate thereof. The conductive plug(s) can extend away from the substrate outer surface a distance which is greater or less than a conductive line height of a conductive line adjacent which the plug is formed. In the former instance and in accordance with one aspect, such plug(s) can include a portion which overlaps with the contact pad of the associated conductive line.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
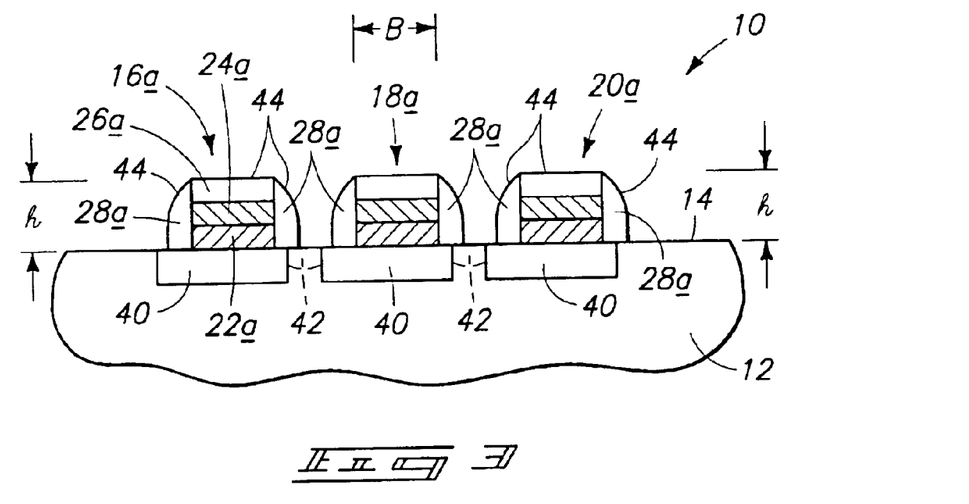
FIG. 3 is a diagrammatic sectional view of a semiconductor wafer fragment at one processing step in accordance with one implementation of the invention.

Referring to FIG. 3, like numerals from the above-described embodiment are utilized where appropriate, with differences being indicated by the suffix "a" or with different numerals. Accordingly, a plurality of conductive runners or lines 16a, 18a, and 20a are formed over outer surface 14, and can be formed over oxide isolation regions 40. Exemplary isolation regions include shallow trench isolation regions or field oxide regions formed through LOCOS techniques. The conductive lines comprise respective outermost surfaces 44 portions of which define respective conductive line heights h outwardly of outer surface 14. Diffusion regions 42 can be provided between the conductive lines, and preferably comprise n-type regions having doping concentrations of $1\times10^{18}$ cm$^{-3}$. The diffusion regions can be provided in a separate doping step, or through outdiffusion of dopant from conductive material which will become more apparent below. An outer contact opening target area B is defined by conductive line 18a.

Figure 4:
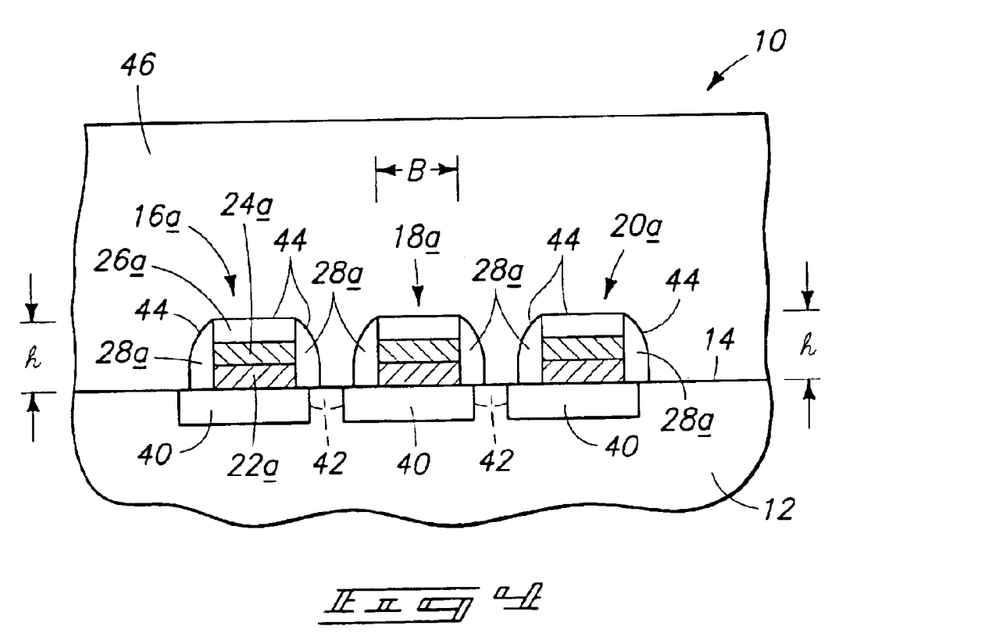
FIG. 4 is a view of the FIG. 3 wafer fragment at another processing step.

Referring to FIG. 4, an insulating material layer 46 is formed over substrate 12. An exemplary material is borophosphosilicate glass.

Figure 5:
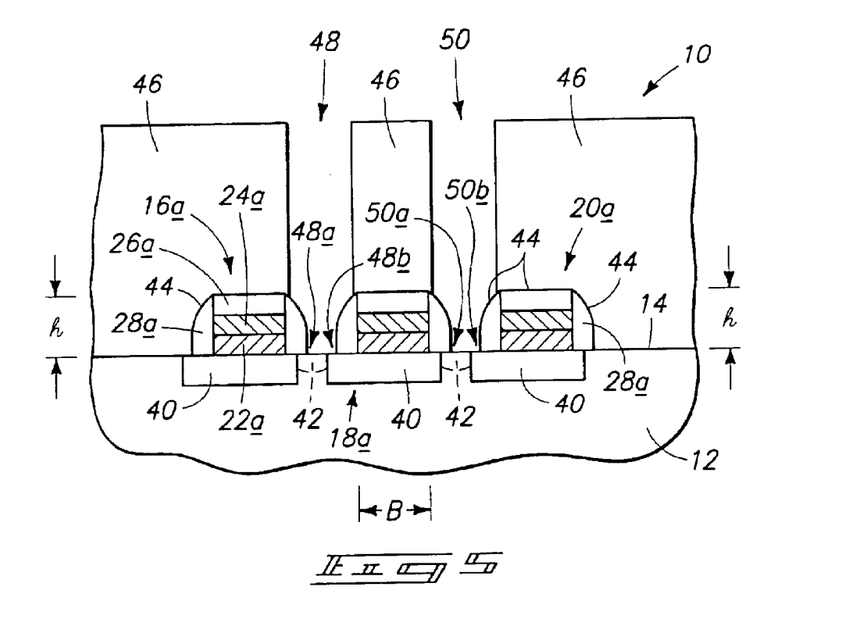
FIG. 5 is a view of the FIG. 3 wafer fragment at another processing step.

Referring to FIG. 5, at least one, and preferably a pair of contact openings 48, 50 are formed through layer 46 and preferably outwardly expose respective portions of outer surface 14. The contact openings can be formed through a suitable masked etch of layer 46. Preferably, the individual contact openings are essentially self-aligned at and to the substrate at two locations 48a, 48b, and 50a, 50b respectively, along a line extending laterally from conductive runner or line 18a. In a preferred implementation, one of the two locations for the individual contact openings is defined by conductive runner 18a. Even more preferably, the other of the two respective locations are defined by respective next adjacent conductive lines 16a, 20a.

Figure 6:
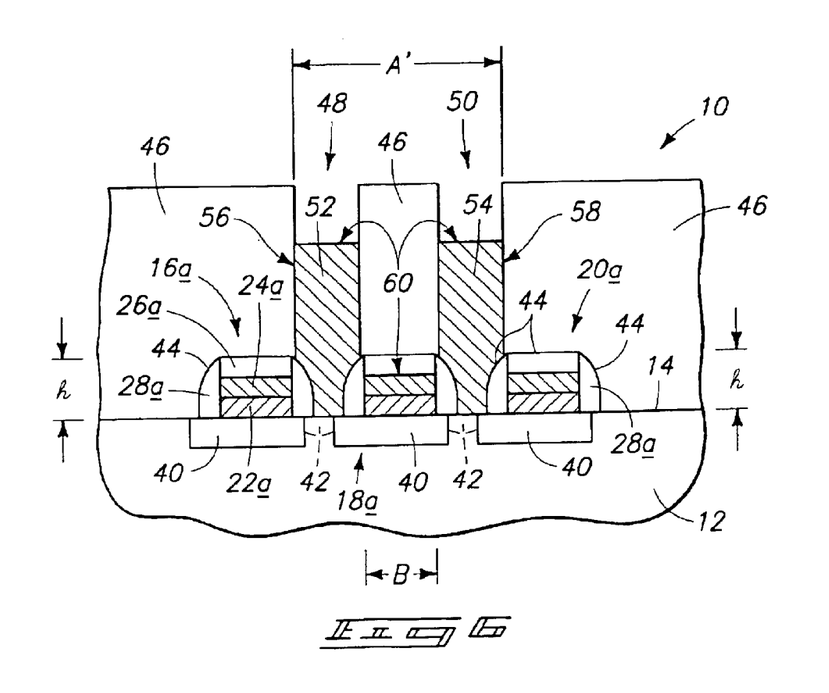
FIG. 6 is a view of the FIG. 3 wafer fragment at another processing step.

Referring to FIG. 6, and in accordance with a first implementation, first conductive material 52, 54 is formed within contact openings 48, 50, between the illustrated conductive lines and laterally proximate or adjacent the contact pad defined by conductive line 18a. An exemplary and preferred first conductive material is conductively doped polysilicon, which can serve as a source of outdiffused dopant for regions 42. The polysillcon can be chemical vapor deposited over the substrate and subsequently removed through conventional processing to provide conductive plugs 56, 58. Such conventional processing can include planarization processing to isolate conductive material within the respective contact openings, followed by a suitable timed etch to recess the conductive material within the contact openings. In the illustrated example, conductive plugs are formed on both sides of conductive line 18a. It is possible, however, for only one conductive plug to be formed on either side of conductive line 18a. The individual conductive plugs are essentially self-aligned at and to the substrate at the same locations as are the contact openings in which each is formed.

Figure 7:
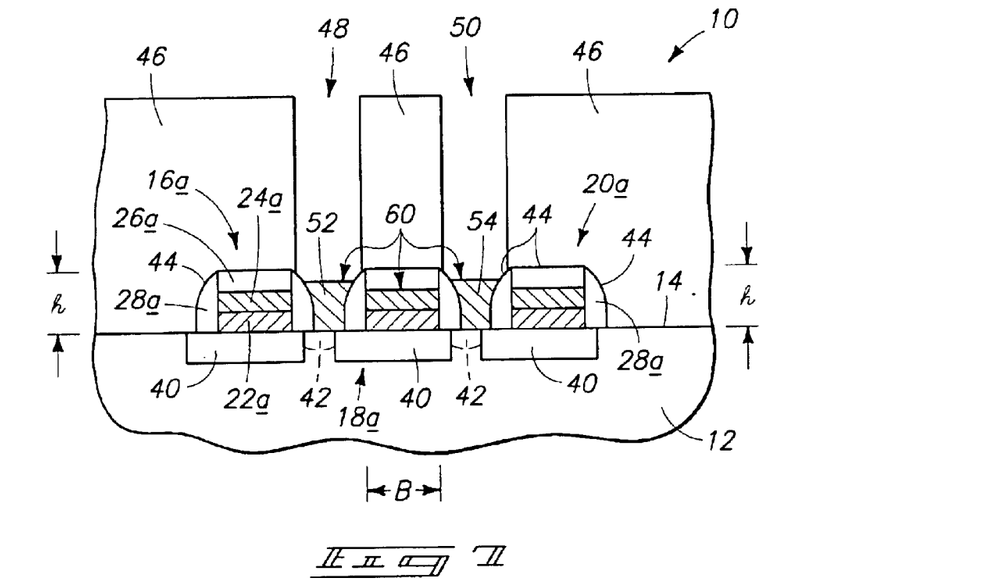
FIG. 7 is a view which is similar to the FIG. 6 view, but which shows an alternate embodiment in accordance with another implementation of the invention.

Referring still to FIG. 6, the illustrated conductive plugs are formed to preferably extend outwardly from outer surface 14 a distance which is greater than conductive runner height h. Because the plugs in this example are formed atop the same surface (outer surface 14) atop which the conductive lines are formed, each extends elevationally beyond the respective conductive line heights. Such plugs could, however, be formed to extend from outer surface 14 a distance which is less than or no further than the conductive runner height. This could, for example, be done by conducting a timed etch for a longer period of time than is suitable for forming the illustrated FIG. 6 plugs. An exemplary construction is shown in FIG. 7.

In one implementation, individual conductive plugs include portions which overlap with portions of conductive line 18a and the respective next adjacent conductive lines 16a, 20a. In a preferred implementation, the respective plugs overlap with the outermost surfaces of the conductive lines adjacent which each is formed. Accordingly, portions of at least one, and preferably both conductive plugs can overlap target area B. Collectively, the conductive material of conductive plugs 56, 58, and the conductive material of conductive line 18a define an effective contact pad having an outermost surface 60, which defines an effectively widened target area A'. The widened target area reduces the wafer area which was formerly required by the prior art widened landing pad (FIGS. 1 and 2) described above.

Alternately considered, effective contact pad outermost surface 60 defines a generally non-planar surface. In a preferred implementation, at least one of the conductive plugs, and preferably both, define a region of outermost surface 60 having a higher topographical elevation than the region defined by the contact pad of tine 18a.

Figure 8:
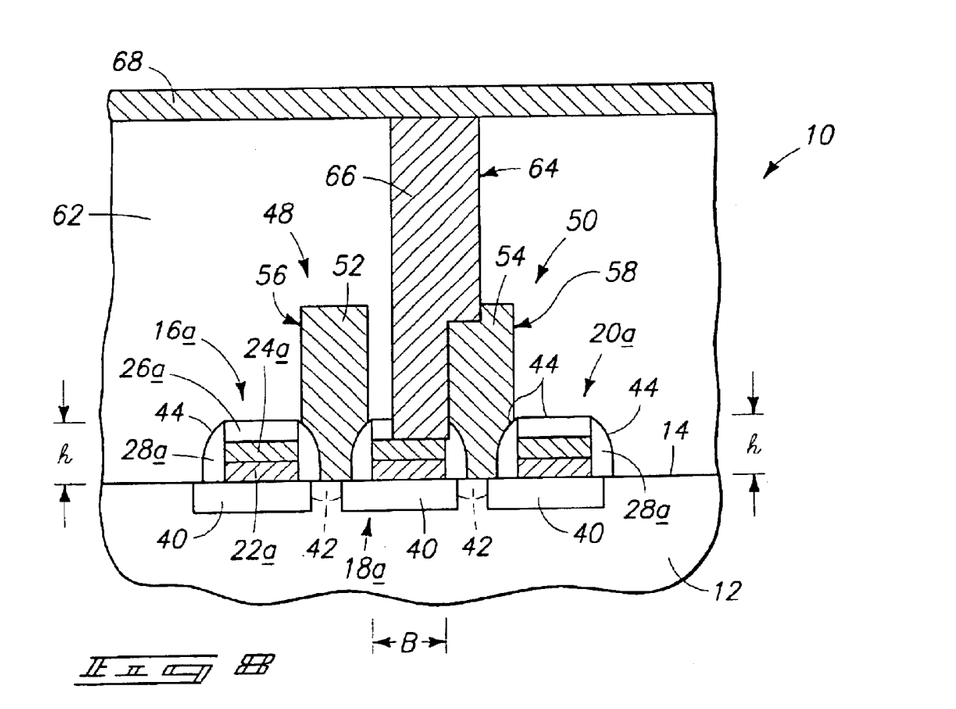
FIG. 8 is a view of the FIG. 3 wafer fragment at another processing step.

Referring to FIG. 8, a layer 62 of insulative material is formed over the substrate and the effective contact pad. A contact opening 64 is etched or otherwise formed through layer 62 to outwardly expose portions of the effective contact pad. Preferably, the contact pad of line 18a is exposed, with any mask misalignment resulting in exposure of conductive material of either or both of conductive plugs 56, 58. Subsequently, a second conductive material 66 is formed within contact opening 64 and in electrical communication with at least portions of the contact pad and, if exposed, an associated portion of a conductive plug. A bit line 68 can then be formed over the substrate and in electrical communication with material 66.

Figure 9:
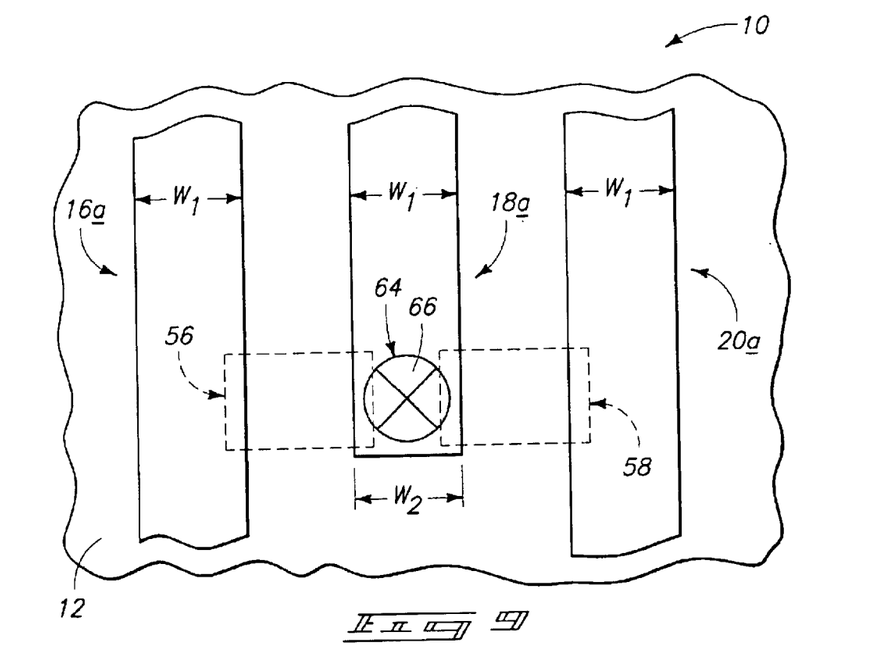
FIGS. 9 and 10 are top plan views of semiconductor wafer fragments which have been processed in accordance with the inventive methodologies.

Referring to FIG. 9, conductive lines 16a, 18a and 20a have first respective line widths $w_1$ at respective first locations and second line widths $w_2$ at respective second locations, an exemplary second line width and location being shown for line 18a. The second line width corresponds to a line location where at least a portion of contact opening 64 is formed. In one implementation, the first and second line widths are essentially the same or equivalent. This is made possible because the above-described conductive plugs 56, 58 (shown in dashed lines in FIGS. 9 and 10) reduce, if not eliminate, the requirement of the FIG. 1 widened landing pad. The illustrated conductive plugs provide an effective contact pad width which is greater than second line width $w_2$, and include respective portions proximate the first line width $w_1$ which overlap with or extend elevationally over the conductive portions, e.g. the contact pad, of line 18a. The plugs can also include portions which overlap with corresponding portions of conductive lines 16a, 20a. This compensates for a contact opening mask misalignment by enabling desired contact to be made through a respective one of the conductive plugs as discussed above.

Figure 10:
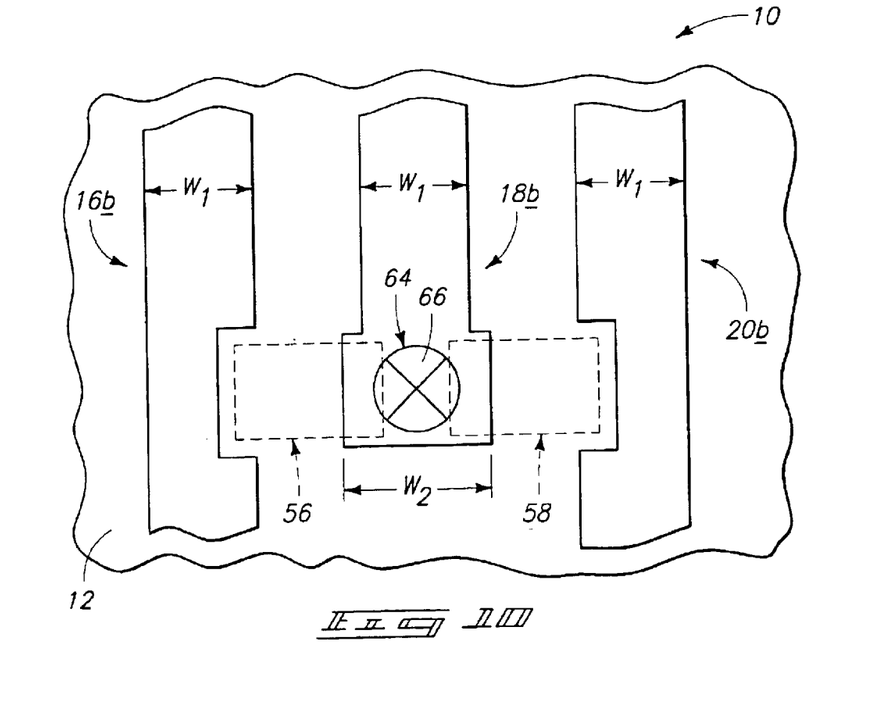

Referring to FIG. 10 and in accordance with another implementation, localized first and second line widths $w_1$, $w_2$ respectively, are different with second line width $w_2$ being greater than first line width $w_1$. In this example, the second line width defines a portion of a landing pad which is smaller in dimension than the FIG. 1 landing pad. Portions of conductive lines 16b and 20b laterally proximate respective conductive plugs 56, 58 can be tapered or otherwise configured to accommodate the somewhat wider landing pad.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a contact opening to a conductive runner comprising:

forming a conductive runner having an outer contact opening target area at a first elevation over a semiconductive substrate;

forming insulating material over the conductive runner;

forming at least one conductive plug using the insulating material laterally adjacent the outer contact opening target area, and the at least one conductive plug extending upward to less than the first elevation, the at least one conductive plug being formed within a contact opening in the insulating material which is essentially self aligned at and to the semiconductive substrate at two locations disposed laterally of the conductive runner;

forming an insulative material atop the conductive runner and the at least one conductive plug; and forming a contact opening to and overlapping the outer contact opening target area and the at least one conductive plug through the insulative material overlying the conductive runner and the at least one conductive plug.

2. The method of forming a contact opening of claim 1, wherein:

the conductive runner comprises an outermost surface which defines a conductive runner height outwardly of an outer surface of the semiconductive substrate; and the forming of the at least one conductive plug comprises forming the at least one conductive plug to extend outwardly from the outer surface of the semiconductive substrate a distance which is less than the conductive runner height.

3. The method of forming a contact opening of claim 1, wherein one of the self-aligned locations is defined by the conductive runner.

4. The method of forming a contact opening of claim 3, wherein the other of the self-aligned locations is defined by a next adjacent conductive runner.

5. The method of forming a contact opening of claim 2, wherein the at least one conductive plug comprises a portion which overlaps with the conductive runner.

6. The method of forming a contact opening of claim 1, wherein:

the forming of the at least one conductive plug comprises forming another conductive plug within the insulating material laterally adjacent the outer contact opening target area, the conductive plugs being disposed on either side of the outer contact opening target area.

7. The method of forming a contact opening of claim 6, wherein one of the respective self-aligned locations for individual conductive plugs is defined by the conductive runner, and the other respective self-aligned location is defined by respective next adjacent conductive runners.

8. The method of forming a contact opening of claim 7, wherein:

the conductive runner comprises an outermost surface which defines a conductive runner height outwardly of a substrate outer surface; and the forming of the conductive plugs comprise forming both plugs to extend outwardly from the substrate outer surface a distance which is less than the conductive runner height and to overlap with the conductive runner.

9. The method of forming a contact opening of claim 7, wherein:

the conductive runner comprises an outermost surface which defines a conductive runner height outwardly of a substrate outer surface; and the forming of the conductive plugs comprise forming both plugs to extend outwardly from the substrate outer surface a distance which is less than the conductive runner height.

10. A method of forming a contact opening to a conductive line comprising:

forming a conductive line over a substrate, the conductive line having a conductive line width and a target area with which electrical communication is desired, the target area having a first elevation above the substrate;

forming a pair of conductive plugs laterally proximate the target area and disposed on opposing sides of the conductive line and defining together therewith an effectively widened target area, the conductive plugs being self-aligned to the substrate adjacent the conductive line and extending outward from the substrate a distance less than the first elevation; and outwardly exposing at least a portion of the widened target area through insulative material disposed atop the widened target area and outwardly exposing a portion of the conductive line.

11. The method of forming a contact opening of claim 10, wherein the forming of the pair of conductive plugs comprises forming at least one of the conductive plugs between the conductive line and a next adjacent conductive line.

12. The method of forming a contact opening of claim 10, wherein the forming of the pair of conductive plugs comprises forming the conductive plugs between the conductive line and respective next adjacent conductive lines.

13. The method of forming a contact opening of claim 10, wherein the forming of the pair of conductive plugs comprises forming at least one of the plugs to overlap with the conductive line.

14. The method of forming a contact opening of claim 10, wherein the forming of the pair of conductive plugs comprises forming the plugs to overlap with the conductive line.

15. The method of forming a contact opening of claim 1, wherein:
   the conductive runner comprises an outermost surface which defines a conductive runner height outwardly of a substrate outer surface; and
   the forming of the conductive plug comprises forming a doped polysilicon plug to extend outwardly from the substrate outer surface a distance which is no greater than the conductive runner height.

16. The method of forming a contact opening of claim 1, wherein forming at least one conductive plug comprises forming at least one conductive plug within a contact opening in the insulating material which is essentially self aligned at and to the semiconductive substrate at two locations along a line extending laterally from the conductive runner.

17. The method of forming a contact opening of claim 10, wherein outwardly exposing comprises etching an opening through the insulative material to expose at least a portion of the widened target area.

18. The method of forming a contact opening of claim 10, wherein the insulative material comprises forming a dielectric layer, and wherein outwardly exposing comprises etching an opening through the dielectric layer to expose at least a portion of the widened target area.

19. A method of forming a contact opening to a conductive runner comprising:
   forming a conductive runner having an outer contact opening target area at a first elevation over a silicon semiconductive substrate;
   forming insulating material over the conductive runner;
   forming at least one conductive plug using the insulating material laterally adjacent the outer contact opening target area, and the at least one conductive plug extending upward to less than the first elevation, the at least one conductive plug being formed within a contact opening in the insulating material which is essentially self aligned at and to the semiconductive substrate at two locations disposed laterally of the conductive runner; and
   etching a contact opening to and overlapping the outer contact opening target area and the at least one conductive plug through an insulative material overlying the conductive runner and the at least one conductive plug.

20. The method of forming a contact opening of claim 19, wherein one of the self-aligned locations is defined by the conductive runner.

21. The method of forming a contact opening of claim 20, wherein the other of the self-aligned locations is defined by a next adjacent conductive runner.

22. The method of forming a contact opening of claim 19, wherein the at least one conductive plug comprises a portion which overlaps with the conductive runner.

23. The method of forming a contact opening of claim 19, wherein the forming of the at least one conductive plug comprises forming another conductive plug within the insulating material laterally adjacent the runner target area, the conductive plugs being disposed on either side of the runner target area.

24. The method of forming a contact opening of claim 23, wherein one of the respective self-aligned locations for individual conductive plugs is defined by the conductive runner, and the other respective self-aligned location is defined by respective next adjacent conductive runners.

25. The method of forming a contact opening of claim 24, wherein:
   the conductive runner comprises an outermost surface which defines a conductive runner height outwardly of a substrate outer surface; and
   the forming of the conductive plugs comprise forming both plugs to extend outwardly from the substrate outer surface a distance which is less than the conductive runner height and to overlap with the conductive runner.

26. The method of forming a contact opening of claim 24, wherein:
   the conductive runner comprises an outermost surface which defines a conductive runner height outwardly of a substrate outer surface; and
   the forming of the conductive plugs comprise forming both plugs to extend outwardly from the substrate outer surface a distance which is less than the conductive runner height.

27. The method of forming a contact opening of claim 1, wherein the forming of the at least one conductive plug comprises forming an entirety of the at least one conductive plug below the first elevation.

28. The method of forming a contact opening of claim 1, wherein the outer contact opening target area comprises a conductive surface of the conductive runner, and the at least one conductive plug is formed spaced from the conductive surface.

29. The method of forming a contact opening of claim 1, wherein the conductive runner comprises a first conductive runner laterally adjacent a second conductive runner, and wherein an entirety of the at least one conductive plug is disposed between the first and second conductive runners.

30. The method of forming a contact opening of claim 10, wherein the forming of the pair of the conductive plugs comprises forming an entirety of individual ones of the conductive plugs below the first elevation.

31. The method of forming a contact opening of claim 10, wherein the conductive line comprises a first conductive line laterally adjacent a second conductive line, and wherein an entirety of one of the conductive plugs is disposed between the first and second conductive lines.

32. The method of forming a contact opening of claim 10, wherein the conductive line comprises the only conductive line between the conductive plugs.

33. The method of forming a contact opening of claim 10, wherein the conductive line comprises a first conductive line laterally adjacent a second conductive line, and wherein one of the conductive plugs comprises a generally planar surface extending from the first conductive line to the second conductive line.

34. The method of forming a contact opening of claim 10, wherein the pair of the conductive plugs is formed spaced from the target area.

35. The method of forming a contact opening of claim 19, wherein the forming of the at least one conductive plug comprises forming an entirety of the at least one conductive plug below the first elevation.

36. The method of forming a contact opening of claim 19, wherein the conductive runner comprises a first conductive runner laterally adjacent a second conductive runner, and wherein an entirety of the at least one conductive plug is disposed between the first and second conductive runners.

37. The method of forming a contact opening of claim 19, wherein the conductive runner comprises a first conductive runner laterally adjacent a second conductive runner, and wherein the at least one conductive plug comprises a generally planar surface extending from the first conductive runner to the second conductive runner.

38. The method of forming a contact opening of claim 19, wherein the outer contact opening target area comprises a conductive surface of the conductive runner, and the at least one conductive plug is formed spaced from the conductive surface.

39. A method of forming a contact opening to a conductive runner comprising:

forming a conductive runner comprising a conductive surface at a first elevation over a semiconductive substrate;

forming a first insulating material over and laterally adjacent to the conductive runner;

forming a conductive plug laterally spaced adjacent the conductive surface of the conductive runner, the at least one conductive plug and the conductive surface comprising a target area, and the conductive plug extending upward to less than the first elevation and formed within a first contact opening in the first insulating material laterally adjacent to the conductive runner;

forming a second insulating material atop the conductive runner and the at least one conductive plug; and forming a second contact opening within the second insulating material, the second contact opening overlapping the target area.

40. The method of forming a contact opening of claim 39, wherein the conductive runner comprises a first conductive runner laterally adjacent a second conductive runner, and wherein an entirety of the conductive plug is disposed between the first and second conductive runners.

41. The method of forming a contact opening of claim 39, wherein the conductive runner comprises a first conductive runner laterally adjacent a second conductive runner, and wherein the conductive plug comprises a generally planar surface extending from the first conductive runner to the second conductive runner.

* * * * *

UNITED STATES PATENT AND TRADEMARK OFFICE
CERTIFICATE OF CORRECTION

PATENT NO. : 6,753,241 B2
DATED : June 22, 2004
INVENTOR(S) : Dennison, Charles H.

It is certified that error appears in the above-identified patent and that said Letters Patent is hereby corrected as shown below:

Title page,
Item [56], References Cited, U.S. PATENT DOCUMENTS, please delete "6,004,361 A 12/1999 Barry et al. ……….. 438/975" after "5,972,758 A 10/1999 Liang" and insert -- 6,004,861 A 12/1999 Gardner et al. --.

Signed and Sealed this

Twenty-fifth Day of January, 2005

JON W. DUDAS
*Director of the United States Patent and Trademark Office*